US009424949B2

(12) United States Patent
Hong et al.

(10) Patent No.: US 9,424,949 B2
(45) Date of Patent: Aug. 23, 2016

(54) SHIFT REGISTER CIRCUIT

(71) Applicant: AU OPTRONICS CORP., Hsin-Chu (TW)

(72) Inventors: Kai-Wei Hong, Hsin-Chu (TW); Pin-Yu Chan, Hsin-Chu (TW); Yung-Chih Chen, Hsin-Chu (TW); Li-Wei Liu, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 169 days.

(21) Appl. No.: 14/481,183

(22) Filed: Sep. 9, 2014

(65) Prior Publication Data

US 2015/0318051 A1 Nov. 5, 2015

(30) Foreign Application Priority Data

May 5, 2014 (TW) ............................ 103115993 A

(51) Int. Cl.
*G11C 19/00* (2006.01)
*G11C 19/28* (2006.01)
*G11C 19/18* (2006.01)

(52) U.S. Cl.
CPC .............. *G11C 19/28* (2013.01); *G11C 19/186* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 7,949,086 B2 | 5/2011 | Tsai et al. | | |
| 8,537,094 B2 * | 9/2013 | Yang | G09G 3/3677 | 345/100 |
| 2007/0164971 A1 * | 7/2007 | Chang | G09G 3/3674 | 345/100 |
| 2008/0285705 A1 * | 11/2008 | Wei | G09G 3/006 | 377/78 |
| 2010/0150303 A1 * | 6/2010 | Tsai | G11C 19/28 | 377/79 |
| 2010/0260312 A1 * | 10/2010 | Tsai | G09G 3/3677 | 377/79 |
| 2014/0105351 A1 * | 4/2014 | Chan | G11C 19/184 | 377/64 |
| 2014/0355732 A1 * | 12/2014 | Lin | G06F 3/041 | 377/64 |
| 2015/0255034 A1 * | 9/2015 | Hong | G09G 3/3674 | 345/214 |
| 2015/0279288 A1 * | 10/2015 | Dai | G02F 1/13306 | 345/690 |

* cited by examiner

*Primary Examiner* — Tuan T Lam
(74) *Attorney, Agent, or Firm* — WPAT, PC; Justin King

(57) ABSTRACT

A shift register circuit includes a first transistor, a capacitor, a pull-up control circuit, a first pull-down circuit, a pull-down control circuit, a second pull-down circuit and a compensation circuit. The compensation circuit further includes a second transistor, a third transistor, a fourth transistor, a fifth transistor and a sixth transistor. The second transistor, the third transistor, the fourth transistor, and the fifth transistor are corporately used to output a compensation pulse; and the sixth transistor is used to output the compensation pulse to a gate terminal of the first transistor thereby compensating a control signal.

8 Claims, 4 Drawing Sheets

SHIFT REGISTER CIRCUIT

TECHNICAL FIELD

The present disclosure relates to a shift register circuit, and more particularly to a shift register circuit with improved charging and discharging ability.

BACKGROUND

Conventionally, a shift register is configured to determine whether to output an enabled gate driving signal according to an internal control signal and maintain the gate driving signal and the control signal in a low-voltage level while in a period of no need to output an enabled gate driving signal, thereby preventing the shift register from outputting the enabled gate driving signal to mistakenly drive the respective gate lines. Thus, it is an important subject for a shift register to quickly pull down the gate driving signal and the control signal to a low-voltage level and stably maintain the gate driving signal and the control signal in the low-voltage level while there is no need to output an enabled gate driving signal.

SUMMARY

The present disclosure discloses a shift register circuit, which includes a first transistor, a capacitor, a pull-up control circuit, a first pull-down circuit, a second pull-down circuit, a pull-down control circuit and a compensation circuit. The first transistor has a first terminal, a second terminal and a control terminal. The first transistor is configured to have the first terminal thereof for receiving an Nth-stage clock signal, and the second terminal thereof functioned as an output terminal of the shift register circuit and for outputting an Nth-stage gate pulse. The capacitor has a first terminal and a second terminal The capacitor is configured to have the first terminal thereof electrically coupled to the control terminal of the first transistor. The pull-up control circuit is configured to receive a (N−2)th-stage gate pulse and transmit the (N−2)th-stage gate pulse to the control terminal of the first transistor. The first pull-down circuit is configured to determine, according to a (N+2)th-stage gate pulse, whether to pull down a voltage level at the output terminal of the shift register circuit to a preset low voltage level or not and whether to electrically couple the control terminal of the first transistor to the output terminal of the shift register circuit or not. The second pull-down circuit is configured to determine, according to a pull-down control signal, whether to electrically couple the control terminal of the first transistor to the output terminal of the shift register circuit or not and determine whether to pull down a voltage level at the second terminal of the capacitor and a voltage level at the output terminal of the shift register circuit to the preset low voltage level or not. The pull-down control circuit is configured to provide the pull-down control signal and determine a voltage level of the pull-down control signal according a voltage level at the control terminal of the first transistor. The compensation circuit is configured to generate a compensation pulse and determine whether to output the compensation pulse to the second terminal of the capacitor according a voltage level at the control terminal of the first transistor. An enabled period of one pulse of the Nth-stage clock signal is located in an enabled period of the compensation pulse and the enabled period of the compensation pulse is longer than the enabled period of the pulse of the Nth-stage clock signal.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
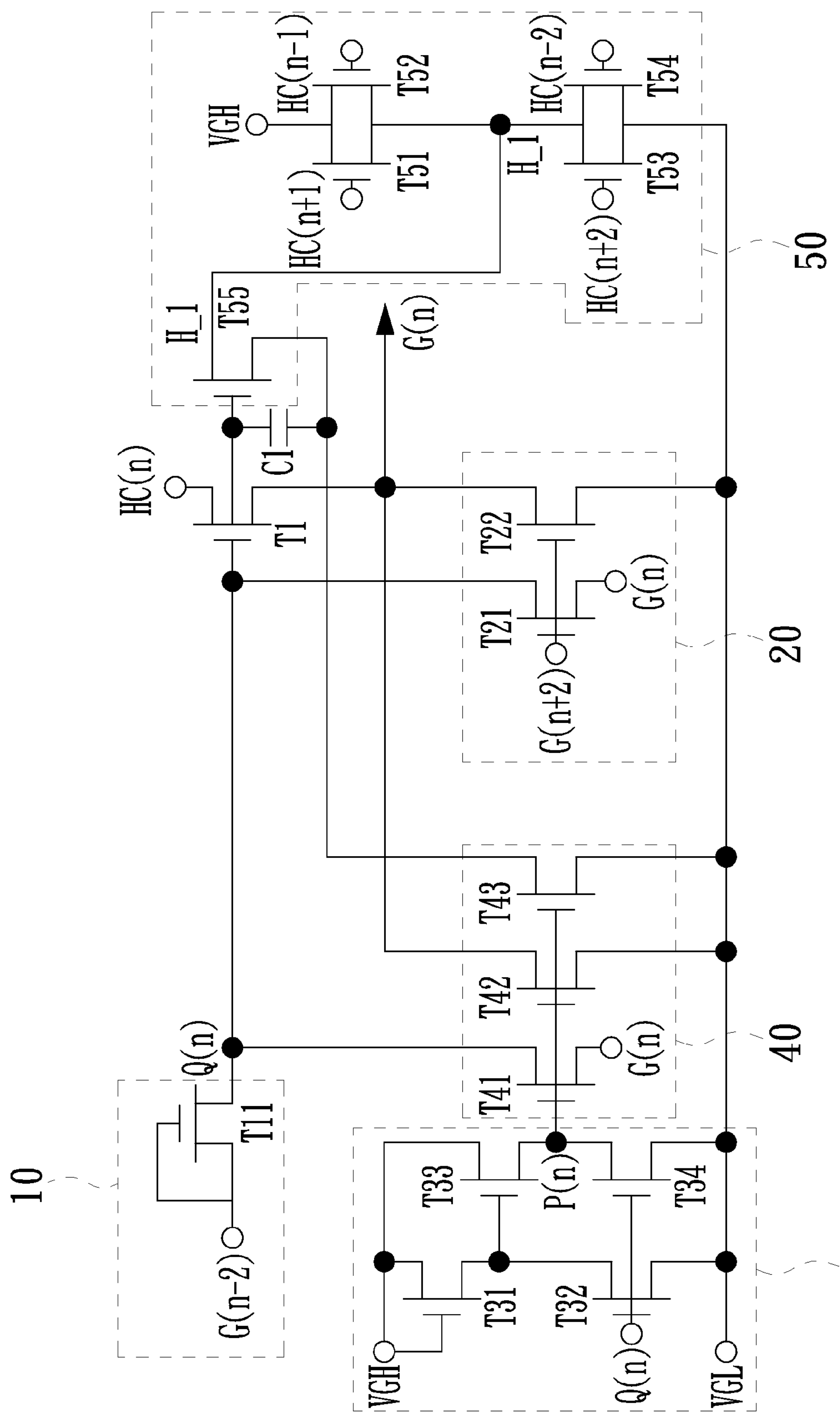
FIG. 1 is a schematic view of a shift register circuit in accordance with an embodiment of the present disclosure.

FIG. 1 is a schematic view of a shift register circuit in accordance with an embodiment of the present disclosure. As shown, the shift register circuit in the present embodiment includes a transistor T1, a capacitor C1, a pull-up control circuit 10, a first pull-down circuit 20, a pull-down control circuit 30, a second pull-down circuit 40 and a compensation circuit 50.

Figure 2:
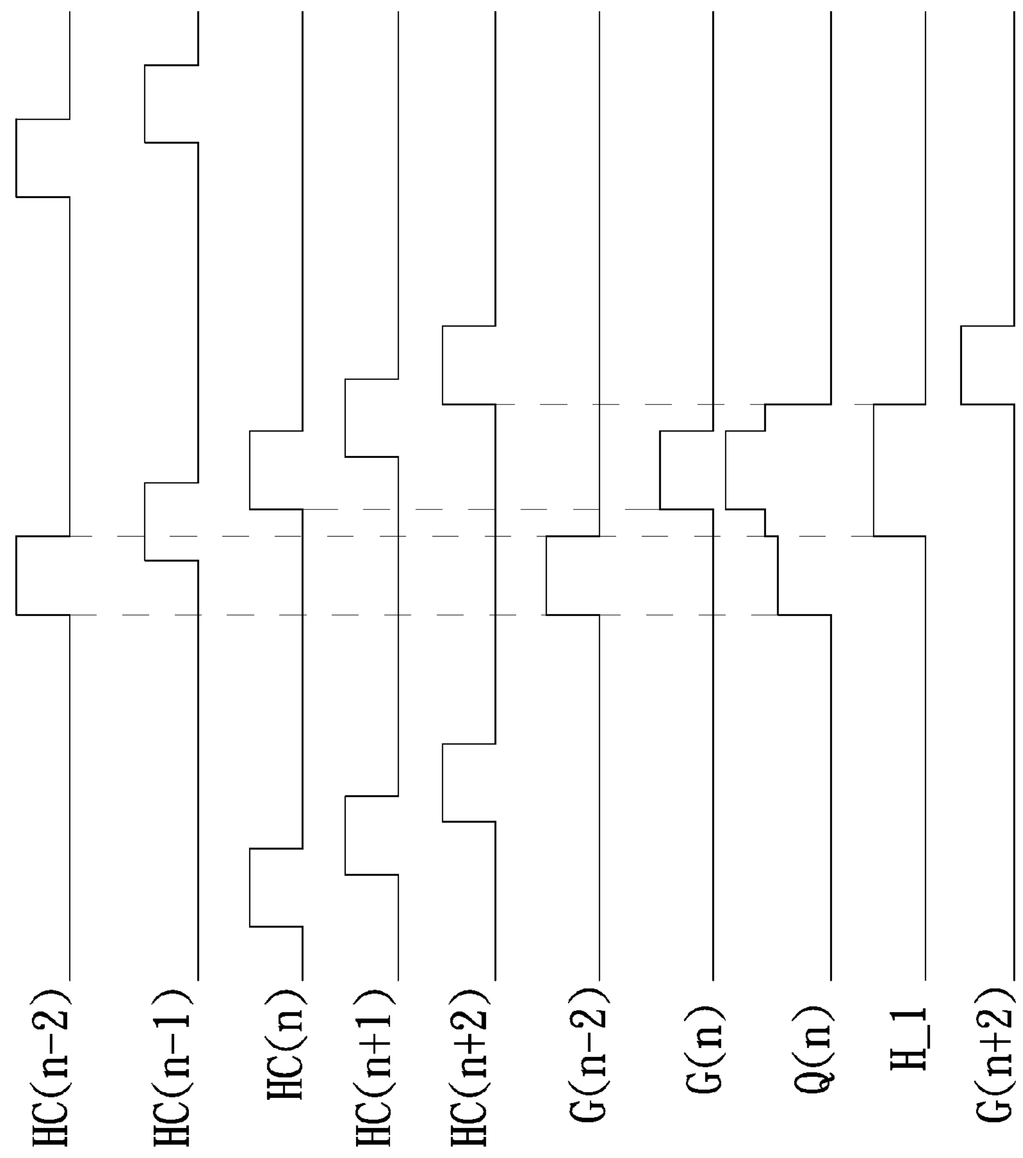
FIG. 2 is a timing diagram of the signals used in the shift register circuit of FIG. 1.

FIG. 2 is a timing diagram of the signals used in the shift register circuit of FIG. 1, which includes a (n−2)th-stage gate pulse G(n−2), a nth-stage gate pulse G(n), a (n+2)th-stage gate pulse G(n+2), a control signal Q(n), a compensation pulse H_1, a (n−2)th-stage clock signal HC(n−2), a (n−1)th-stage clock signal HC(n−1), a nth-stage clock signal HC(n), a (n+1)th-stage clock signal HC(n+1) and a (n+2)th-stage clock signal HC(n+2). The (n−2)th-stage clock signal HC(n−2), the (n−1)th-stage clock signal HC(n−1), the nth-stage clock signal HC(n), the (n+1)th-stage clock signal HC(n+1) and the (n+2)th-stage clock signal HC(n+2) are configured to have the enabled periods thereof with the same time length. In addition, the (n−2)th-stage clock signal HC(n−2) has a preset time lead relative to the (n−1)th-stage clock signal HC(n−1); the (n−1)th-stage clock signal HC(n−1) has the preset time lead relative to the nth-stage clock signal HC(n); the nth-stage clock signal HC(n) has the preset time lead relative to the (n+1)th-stage clock signal HC(n+1); and the (n+1)th-stage clock signal HC(n+1) has the preset time lead relative to the (n+2)th-stage clock signal HC(n+2).

The transistor T1 has a first terminal, a second terminal and a control terminal. The transistor T1 is configured to have its control terminal electrically coupled to the pull-up control circuit 10; its first terminal for receiving the nth-stage clock signal HC(n); and its second terminal functioned as an output terminal of the shift register circuit of the present embodiment and for outputting the nth-stage gate pulse G(n). The capacitor C1 has a first terminal and a second terminal. The capacitor C1 is configured to have its first terminal electrically coupled to the gate terminal of the transistor T1; and its second terminal electrically coupled to the compensation circuit 50. Specifically, the capacitor C1 is for receiving the compensation pulse H_1 outputted from the compensation circuit 50 and transmit the compensation pulse H_1 to the control terminal of the transistor T1 according to the circuit characteristic thereof.

The pull-up control circuit 10 includes a transistor T11. The transistor T11 has a first terminal, a second terminal and a control terminal. The transistor T11 is configured to have both of its control terminal and its first terminal for receiving the (n−2)th-stage gate pulse G(n−2); and its second terminal electrically coupled to the control terminal of the transistor T1 and for outputting, according to the received (n−2)th-stage gate pulse G(n−2), the control signal Q(n) to the control terminal of the transistor T1.

The first pull-down circuit 20 is configured to determine, according to the (n+2)th-stage gate pulse G(n+2), whether to pull down the voltage level at the output terminal of the shift register circuit (the second terminal of the transistor T1) to a preset low voltage level VGL or not and determine whether to electrically couple the control terminal of the transistor T1 to the output terminal of the shift register circuit (the second terminal of the transistor T1). The first pull-down circuit 20 includes transistors T21, T22. The transistor T21 has a first terminal, a second terminal and a control terminal. The transistor T21 is configured to have its control terminal for receiving the (n+2)th-stage gate pulse G(n+2); its first terminal electrically coupled to the control terminal of the transistor T1; and its second terminal electrically coupled to the output terminal of the shift register circuit (the second terminal of the transistor T1). Specifically, the transistor T21 is for electrically coupling the control terminal of the transistor T1 to the output terminal of the shift register circuit (the second terminal of the transistor T1) according to the (n+2)th-stage gate pulse G(n+2). The transistor T22 has a first terminal, a second terminal and a control terminal. The transistor T22 is configured to have its control terminal for receiving the (n+2)th-stage gate pulse G(n+2); its first terminal electrically coupled to the output terminal of the shift register circuit (the second terminal of the transistor T1); and its second terminal electrically coupled to the preset low voltage level VGL. Specifically, the transistor T22 is for pulling down the voltage level at the output terminal of the shift register circuit (the second terminal of the transistor T1) to the preset low voltage level VGL according to the (n+2)th-stage gate pulse G(n+2). In summary, in the enabled period of the (n+2)th-stage gate pulse G(n+2), the transistors T21, T22 are enabled; the control terminal of the transistor T1 is electrically coupled to the output terminal of the shift register circuit (the second terminal of the transistor T1); and the voltage level at the output terminal of the shift register circuit (the second terminal of the transistor T1) is pulled down to the preset low voltage level VGL.

The pull-down control circuit 30, electrically coupled to the second pull-down circuit 40, is for providing a pull-down control signal P(n) to the second pull-down circuit 40; wherein the voltage level of the pull-down control signal P(n) is determined according to the voltage level at the control terminal of the transistor T1. The pull-down control circuit 30 includes transistors T31, T32, T33 and T34. The transistor T31 has a first terminal, a second terminal and a control terminal. The transistor T31 is configured to have both of its control terminal and its first terminal for receiving a preset high voltage level VGH. The transistor T33 has a first terminal, a second terminal and a control terminal. The transistor T33 is configured to have its control terminal electrically coupled to the second terminal of the transistor T31; its first terminal electrically coupled to both of the control terminal and the first terminal of the transistor T31 and for receiving the preset high voltage level VGH; and its second terminal for outputting the pull-down control signal P(n), which is derived from the preset high voltage level VGH received by the first terminal. The transistor T32 has a first terminal, a second terminal and a control terminal. The transistor T32 is configured to have its control terminal electrically coupled to the control terminal of the transistor T1; its first terminal electrically coupled to the second terminal of the transistor T31 and the control terminal of the transistor T33; and its second terminal electrically coupled to the preset low voltage level VGL. The transistor T34 has a first terminal, a second terminal and a control terminal. The transistor T34 is configured to have its control terminal electrically coupled to the control terminal of the transistor T32; its first terminal electrically coupled to the second terminal of the transistor T33; and its second terminal electrically coupled to the preset low voltage level VGL. In summary, when the transistors T32, T34 are enabled by the control signal Q(n), both of the voltage levels at the first terminals of the transistors T32, T34 are pulled down to the preset low voltage level VGL; accordingly both of the voltage levels at the control terminal and the second terminal of the transistor T33 are pulled down to the preset low voltage level VGL; and accordingly the pull-down control signal P(n) is pulled down to the preset low voltage level VGL. Thus, the second pull-down circuit 40 will not be enabled by the pull-down control signal P(n) and consequentially the transistor T1 can output the nth-stage gate pulse G(2) correctly without having the impact of the second pull-down circuit 40.

The second pull-down circuit 40 is for determining, according to the pull-down control signal P(n), whether to electrically couple the control terminal of the transistor T1 to the output terminal of the shift register circuit (the second terminal of the transistor T1) or not and determining whether to pull down both of the voltage levels at the second terminal of the capacitor C1 and the output terminal of the shift register circuit (the second terminal of the transistor T1) to the preset low voltage level VGL or not. The second pull-down circuit 40 includes transistors T41, T42 and T43. The transistor T41 has a first terminal, a second terminal and a control terminal The transistor T41 is configured to have its control terminal for receiving the pull-down control signal P(n); its first terminal electrically coupled to the control terminal of the transistor T1; and its second terminal electrically coupled to the output terminal of the shift register circuit (the second terminal of the transistor T1). Specifically, the transistor T41 is for determining whether to electrically couple the control terminal of the transistor T1 to the output terminal of the shift register circuit (the second terminal of the transistor T1) or not according to the pull-down control signal P(n). The transistor T42 has a first terminal, a second terminal and a control terminal The transistor T42 is configured to have its control terminal for receiving the pull-down control signal P(n); its first terminal electrically coupled to the output terminal of the shift register circuit (the second terminal of the transistor T1); and its second terminal electrically coupled to the preset low voltage level VGL. Specifically, the transistor T42 is for determining whether to electrically couple the output terminal of the shift register circuit (the second terminal of the transistor T1) to the preset low voltage level VGL or not according to the pull-down control signal P(n). The transistor T43 has a first terminal, a second terminal and a control terminal. The transistor T43 is configured to have its control terminal for receiving the pull-down control signal P(n); its first terminal electrically coupled to the second terminal of the capacitor C1; and its second terminal electrically coupled to the preset low voltage level VGL. Specifically, the transistor T43 is for determining whether to electrically couple the second terminal of the capacitor C1 to the preset low voltage level VGL or not according to the pull-down control signal P(n).

The compensation circuit 50 includes transistors T51, T52, T53, T54 and T55. The transistors T51, T52, T53 and T54 are for corporately generating the compensation pulse H_l according to the respective clock signals received at the control terminals thereof. The transistor T55 is for determining whether to output the compensation pulse H_l to the second terminal of the capacitor C1 or not according to the voltage level at the control terminal of the transistor T1. The transistor T51 has a first terminal, a second terminal and a control terminal. The transistor T51 is configured to have its control terminal for receiving the (n+1)th-stage clock signal HC(n+1); its first terminal for receiving the preset high voltage level VGH; and its second terminal for outputting the compensation pulse H_l derived from the received preset high voltage level VGH. The transistor T52 has a first terminal, a second terminal and a control terminal. The transistor T52 is configured to have its control terminal for receiving the (n−1)th-stage clock signal HC(n−1); its first terminal electrically coupled to the first terminal of the transistor T51 and for receiving the preset high voltage level VGH; and its second terminal electrically coupled to the second terminal of the transistor T52 and for outputting the compensation pulse H_l derived from the received preset high voltage level VGH. The transistor T53 has a first terminal, a second terminal and a control terminal. The transistor T53 is configured to have its control terminal for receiving the (n+2)th-stage clock signal HC(n+2); its first terminal electrically coupled to the second terminal of the transistor T51; and its second terminal electrically coupled to the preset low voltage level VGL. Specifically, the transistor T53 is for pulling down the voltage level of the compensation pulse H_1 to the preset low voltage level VGL according to the (n+2)th-stage clock signal HC(n+2). The transistor T54 has a first terminal, a second terminal and a control terminal. The transistor T54 is configured to have its control terminal for receiving the (n−2)th-stage clock signal HC(n−2); its first terminal electrically coupled to the second terminal of the transistor T52; and its second terminal electrically coupled to the second terminal of the transistor T53 and the preset low voltage level VGL. Specifically, the transistor T54 is for pulling down the voltage level of the compensation pulse H_1 to the preset low voltage level VGL according to the (n−2)th-stage clock signal HC(n−2). The transistor T55 has a first terminal, a second terminal and a control terminal. The transistor T55 is configured to have its control terminal electrically coupled to the control terminal of the transistor T1; its first terminal electrically coupled to the second terminals of the transistors T51, T52 and for receiving the compensation pulse H_1; and its second terminal electrically coupled to the second terminal of the capacitor C1 and for transmitting the compensation pulse H_1 received from the first terminal thereof to the second terminal of the capacitor C1. Specifically, the transistor T55 is for determining whether to output the compensation pulse H_1 to the second terminal of the capacitor C1 or not according to the voltage level at the control terminal of the transistor T1. In addition, it is to be noted that the enabled period of one pulse of the Nth-stage clock signal HC(n) is located in the enabled period of the compensation pulse H_1, and the enabled period of the compensation pulse H_1 is longer than the enabled period of the pulse of the Nth-stage clock signal HC(n), as illustrated in FIG. 2.

The operation of the shift register circuit of the present disclosure will be described in detail as follow with a reference of FIGS. 1, 2. First, the transistor T11 of the pull-up control circuit 10 receives the (n−2)th-stage gate pulse G(n−2) and accordingly outputs the control signal Q(n), and transmits the control signal Q(n) to the control terminal of the transistor T1 thereby enabling the transistor T1. Meanwhile, the pull-down control circuit 30 receives the control signal Q(n), and the transistors T32, T34 in the pull-down control circuit 30 are turned on in the enabled period of the control signal Q(n). As a result, the turned-on transistor T32 pulls down the voltage level at the control terminal of the transistor T33 to the preset low voltage level VGL; the turned-on transistor T34 pulls down the voltage level at the second terminal of the transistor T33 to the preset low voltage level VGL thereby pulling down the voltage level of the pull-down control signal P(n) to the preset low voltage level VGL; and consequentially the second pull-down circuit 40 is disabled. The transistor T55 is turned on along with the turn on of the transistor T1. The turned-on transistor T55 transmits the compensation pulse H_1 received from its first terminal to its second terminal. The compensation pulse H_1 is then transmitted to the control terminal of the transistor T1 through the capacitor C1. In addition, because the enabled period of one of the pulses of the nth-stage clock signal HC(n) is located in the enabled period of the compensation pulse H_1 and the compensation pulse H_1 has a longer enabled period than the pulse of the nth-stage clock signal HC(n) has, the control signal Q(n) has an increased voltage level in the enabled period of the compensation pulse H_1 by being compensated by the compensation pulse H_1, as illustrated in FIG. 2.

Figure 3:
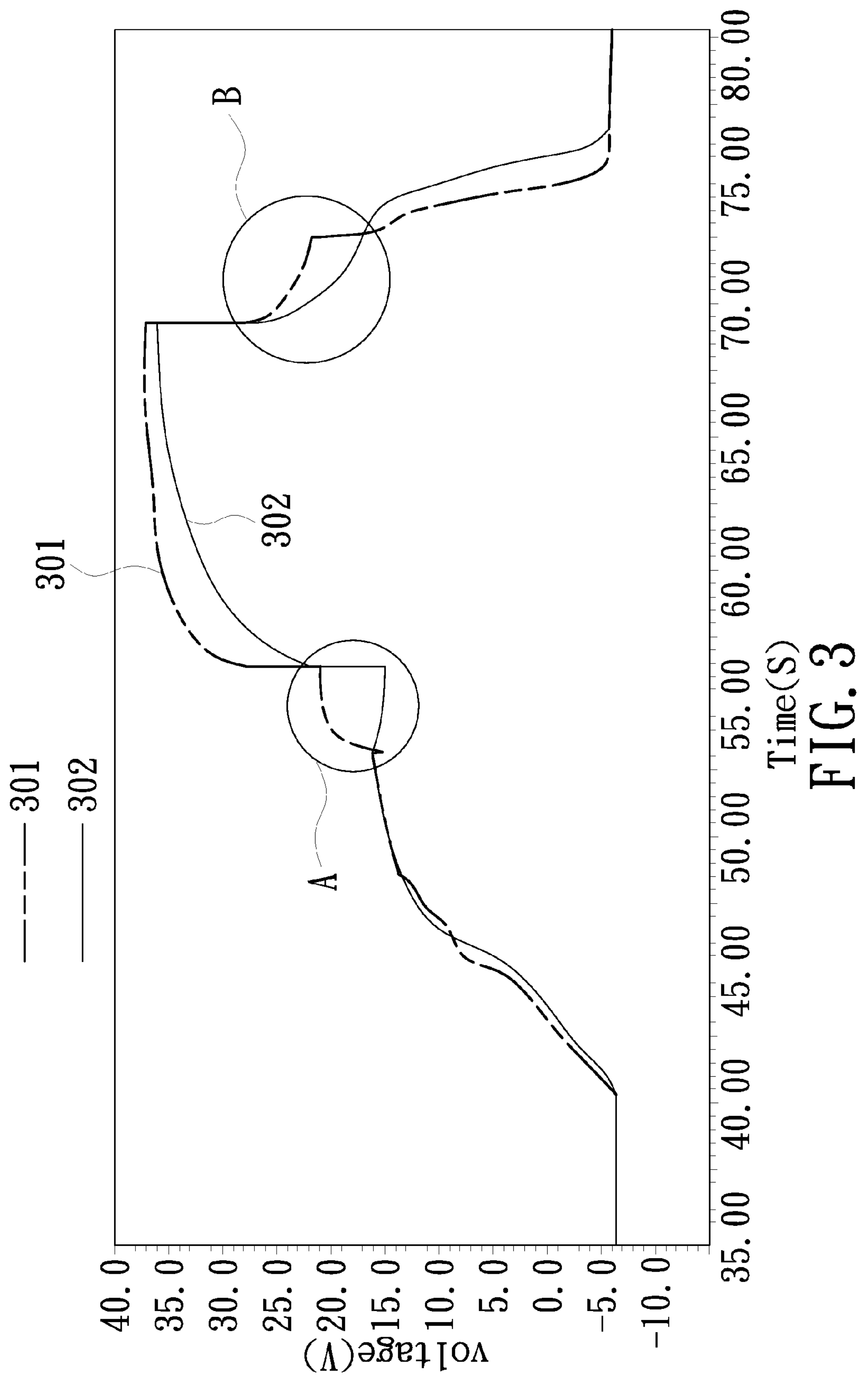
FIG. 3 is a schematic chart illustrating the experimental data obtained from the shift register circuit of the present disclosure and the conventional shift register circuit.

FIG. 3 is a schematic chart illustrating the experimental data obtained from the shift register circuit of the present disclosure and a conventional shift register circuit; wherein the X-axis is time, Y-axis is voltage level, the curve 301 is derived from the shift register circuit of the present disclosure and is referred to as the compensated control signal Q(n) of the present disclosure, and the curve 302 is derived from the conventional shift register circuit and referred to as the conventional control signal Q(n). Specifically, the control signal Q(n) (the curve 301) of the present disclosure is obtained by being compensated by the compensation pulse H_1; and the control signal Q(n) (the curve 302) of the prior art is obtained by compensating the nth-stage gate pulse G(n) (or the nth-stage clock signal HC(n)) to the control terminal of the transistor T1. As illustrated in FIGS. 2, 3, it is to be noted that the enabled period of the compensation pulse H_1 is longer than the enabled period of a pulse of the nth-stage clock signal HC(n) and the enabled period of the compensation pulse H_1 occurs earlier than the enabled period of a pulse of the nth-stage clock signal HC(n), the control signal Q(n) (the curve 301) of the present disclosure can get a compensation earlier than the control signal Q(n) (the curve 302) of the prior art does, as illustrated in the area A in FIG. 3. In addition, because the enabled period of the compensation pulse H_1 is longer than the enabled period of a pulse of the nth-stage clock signal HC(n), the compensated control signal Q(n) (the curve 301) of the present disclosure can have a higher voltage level than the control signal Q(n) (the curve 302) has; as a result, the transistor T1 of the present disclosure has an improved charging and discharging ability. In addition, because the enabled period of the compensation pulse H_1 is longer than the enabled period of a pulse of the nth-stage clock signal HC(n) and the enabled period of the compensation pulse H_1 is ended later than the enabled period of a pulse of the nth-stage clock signal HC(n), the control signal Q(n) (the curve 301) of the present disclosure can still be maintained to have a certain voltage level thereby preventing the crossing voltage of the transistor T1 from dropping too fast and making the transistor T1 of the present disclosure have an improved charging and discharging ability when the first pull-down circuit 20 starts to perform the pull-down operation in response to the receiving of the (n+2)th-stage gate pulse G(n+2), as illustrated in the area B in FIG. 3. Thus, the nth-stage gate pulse G(n) can be pulled down to the preset low voltage level VGL more quickly and thereby preventing the gate line from being driven mistakenly.

Figure 4:
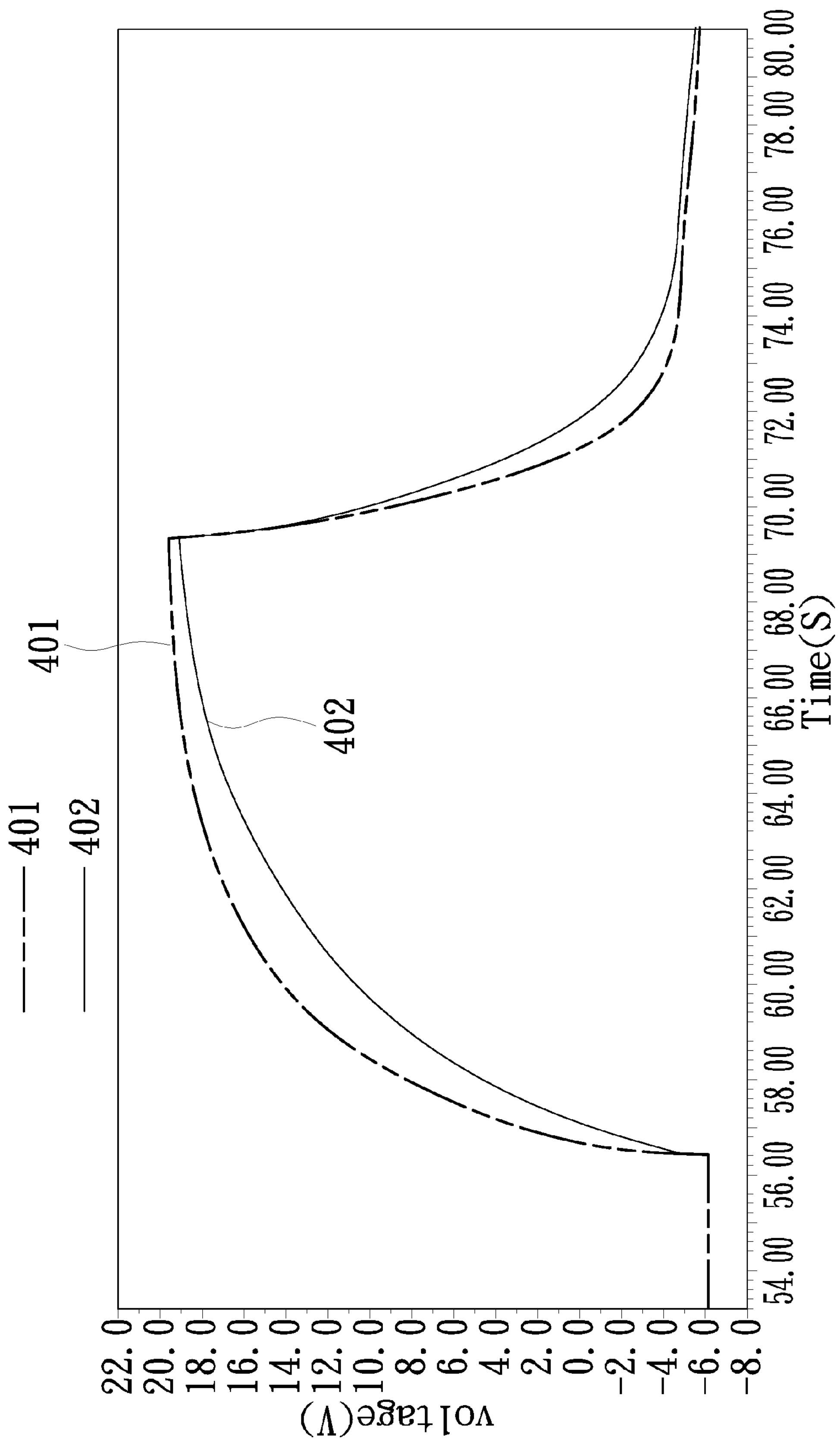
FIG. 4 is a schematic chart illustrating another experimental data obtained from the shift register circuit of the present disclosure and the conventional shift register circuit.

FIG. 4 is a schematic chart illustrating another experimental data obtained from the shift register circuit of the present disclosure and the conventional shift register circuit; wherein the X-axis is time, Y-axis is voltage level, the curve 401 is derived from the shift register circuit of the present disclosure and referred to as the nth-stage gate pulse G(n), and the curve 402 is derived from the conventional shift register circuit and referred to as the conventional nth-stage gate pulse G(n). As illustrated in FIG. 4, because the compensated control signal Q(n) has a higher voltage level and the transistor T1 has an improved charging and discharging ability, it is to be noted that the nth-stage gate pulse G(n) (the curve 401) outputted from the transistor T1 of the present disclosure can be pulled up or pull down to specific voltage levels more quickly, compared with the conventional nth-stage gate pulse G(n) (the curve 402). Thus, the gate lines are prevented from being mistakenly driven.

In summary, by employing a compensation circuit configured to output a compensation pulse and configuring the enabled period of one pulse of the nth-stage clock signal to be located in the enabled period of the compensation pulse and the enabled period of the compensation pulse to be longer than the enabled period of the pulse of the nth-stage clock signal, the shift register circuit of the present disclosure can pull up or pull down the gate pulse more quickly thereby preventing the gate lines from being mistakenly driven.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register circuit, comprising:

a first transistor, comprising a first terminal, a second terminal and a control terminal, the first transistor being configured to have the first terminal thereof for receiving a Nth-stage clock signal, and the second terminal thereof functioned as an output terminal of the shift register circuit and for outputting a Nth-stage gate pulse;

a capacitor, comprising a first terminal and a second terminal, the capacitor being configured to have the first terminal thereof electrically coupled to the control terminal of the first transistor;

a pull-up control circuit, configured to receive a (N−2)th-stage gate pulse and transmit the (N−2)th-stage gate pulse to the control terminal of the first transistor;

a first pull-down circuit, configured to determine, according to a (N+2)th-stage gate pulse, whether to pull down a voltage level at the output terminal of the shift register circuit to a preset low voltage level or not and whether to electrically couple the control terminal of the first transistor to the output terminal of the shift register circuit or not;

a second pull-down circuit, configured to determine, according to a pull-down control signal, whether to electrically couple the control terminal of the first transistor to the output terminal of the shift register circuit or not and determine whether to pull down a voltage level at the second terminal of the capacitor and a voltage level at the output terminal of the shift register circuit to the preset low voltage level or not;

a pull-down control circuit, configured to provide the pull-down control signal and determine a voltage level of the pull-down control signal according a voltage level at the control terminal of the first transistor; and a compensation circuit, configured to generate a compensation pulse and determine whether to output the compensation pulse to the second terminal of the capacitor according a voltage level at the control terminal of the first transistor, wherein an enabled period of one pulse of the Nth-stage clock signal is located in an enabled period of the compensation pulse and the enabled period of the compensation pulse is longer than the enabled period of the pulse of the Nth-stage clock signal.

2. The shift register circuit according to claim 1, wherein the compensation circuit comprises:

a second transistor, comprising a first terminal, a second terminal and a control terminal, the second transistor being configured to have the control terminal thereof for receiving a (n+1)th-stage clock signal, and the first terminal thereof for receiving a preset high voltage level;

a third transistor, comprising a first terminal, a second terminal and a control terminal, the third transistor being configured to have the control terminal thereof for receiving a (n−1)th-stage clock signal, the first terminal thereof electrically coupled to the first terminal of the second transistor, and the second terminal thereof electrically coupled to the second terminal of the second transistor and for outputting the compensation pulse;

a fourth transistor, comprising a first terminal, a second terminal and a control terminal, the fourth transistor being configured to have the control terminal thereof for receiving a (n+2)th-stage clock signal, and the first terminal thereof electrically coupled to the second terminal of the second transistor;

a fifth transistor, comprising a first terminal, a second terminal and a control terminal, the fifth transistor being configured to have the control terminal thereof for receiving a (n−2)th-stage clock signal, the first terminal thereof electrically coupled to the second terminal of the second transistor, and the second terminal thereof electrically coupled to the second terminal of the fourth transistor and the preset low voltage level; and a sixth transistor, comprising a first terminal, a second terminal and a control terminal, the sixth transistor being configured to have the control terminal thereof electrically coupled to the control terminal of the first transistor, the first terminal thereof electrically coupled to the second terminal of the second transistor, and the second terminal thereof electrically coupled to the second terminal of the capacitor.

3. The shift register circuit according to claim 2, wherein the (n−2)th-stage clock signal, the (n−1)th-stage clock signal, the nth-stage clock signal, the (n+1)th-stage clock signal and the (n+2)th-stage clock signal are configured to have enabled periods with a same time length.

4. The shift register circuit according to claim 3, wherein the (n−2)th-stage clock signal has a preset time lead relative to the (n−1)th-stage clock signal; the (n−1)th-stage clock signal has the preset time lead relative to the nth-stage clock signal; the nth-stage clock signal has the preset time lead relative to the (n+1)th-stage clock signal; and the (n+1)th-stage clock signal has the preset time lead relative to the (n+2)th-stage clock signal.

5. The shift register circuit according to claim 1, wherein the pull-up control circuit comprises:

a second transistor, comprising a first terminal, a second terminal and a control terminal, the second transistor being configured to have the control terminal and the first terminal thereof for receiving the (n−2)th-stage gate pulse, and the second terminal thereof electrically coupled to the control terminal of the first transistor.

6. The shift register circuit according to claim 1, wherein the first pull-down circuit comprises:

a second transistor, comprising a first terminal, a second terminal and a control terminal, the second transistor being configured to have the control terminal thereof for receiving the (n+2)th-stage gate pulse, the first terminal thereof electrically coupled to the control terminal of the first transistor, and the second terminal thereof electrically coupled to the output terminal of the shift register circuit; and a third transistor, comprising a first terminal, a second terminal and a control terminal, the third transistor being configured to have the control terminal thereof for receiving the (n+2)th-stage gate pulse, the first terminal thereof electrically coupled to the output terminal of the shift register circuit, and the second terminal thereof electrically coupled to the preset low voltage level.

7. The shift register circuit according to claim 1, wherein the second pull-down circuit comprises:

a second transistor, comprising a first terminal, a second terminal and a control terminal, the second transistor being configured to have the control terminal thereof for receiving the pull-down control signal, the first terminal thereof electrically coupled to the control terminal of the first transistor, and the second terminal thereof electrically coupled to the output terminal of the shift register circuit;

a third transistor, comprising a first terminal, a second terminal and a control terminal, the third transistor being configured to have the control terminal thereof for receiving the pull-down control signal, the first terminal thereof electrically coupled to the output terminal of the shift register circuit, and the second terminal thereof electrically coupled to the preset low voltage level; and a fourth transistor, comprising a first terminal, a second terminal and a control terminal, the fourth transistor being configured to have the control terminal thereof for receiving the pull-down control signal, the first terminal thereof electrically coupled to the second terminal of the capacitor, and the second terminal thereof electrically coupled to the preset low voltage level.

8. The shift register circuit according to claim 1, wherein the pull-down control circuit comprises:

a second transistor, comprising a first terminal, a second terminal and a control terminal, the second transistor being configured to have the control terminal and the first terminal thereof for receiving a preset high voltage level;

a third transistor, comprising a first terminal, a second terminal and a control terminal, the third transistor being configured to have the control terminal thereof electrically coupled to the second terminal of the second transistor, the first terminal thereof electrically coupled to both of the control terminal and the first terminal of the second transistor, and the second terminal thereof for outputting the pull-down control signal;

a fourth transistor, comprising a first terminal, a second terminal and a control terminal, the fourth transistor being configured to have the control terminal thereof electrically coupled to the control terminal of the first transistor, the first terminal thereof electrically coupled to the second terminal of the second transistor and the control terminal of the third transistor, and the second terminal thereof electrically coupled to the preset low voltage level; and a fifth transistor, comprising a first terminal, a second terminal and a control terminal, the fifth transistor being configured to have the control terminal thereof electrically coupled to the control terminal of the fourth transistor, the first terminal thereof electrically coupled to the second terminal of the third transistor, and the second terminal thereof electrically coupled to the preset low voltage level.

* * * * *